United States Statutory Invention Registration [19]

[11] Reg. Number: H274

Ruggerio

[43] Published: May 5, 1987

[54] METHOD OF MANUFACTURING AN INTEGRATED CIRCUIT CHIP AND INTEGRATED CIRCUIT CHIP PRODUCED THEREBY

[76] Inventor: Paul Ruggerio, 150 Hartwell Ave., Littleton, Mass. 01460

[21] Appl. No.: 738,359

[22] Filed: May 28, 1985

[51] Int. Cl.[4] ..... H01L 23/48; H01L 21/58

[52] U.S. Cl. ..... 357/65; 357/54; 29/591

[58] Field of Search ..... 29/578, 591; 357/54; 148/DIG. 106, DIG. 81; 430/328, 330

[56] References Cited

U.S. PATENT DOCUMENTS

| | | | |
|---|---|---|---|
| 3,700,497 | 10/1972 | Epifano et al. | 29/578 |
| 4,040,083 | 8/1977 | Saiki et al. | 357/54 |
| 4,328,262 | 5/1982 | Kurahashi | 357/54 |

FOREIGN PATENT DOCUMENTS

| | | | |
|---|---|---|---|
| 93969 | 7/1979 | Japan | 29/578 |

OTHER PUBLICATIONS

Allen et al, "Deep U.V. Hardening of Positive Photoresist Patterns", Journal of the Electrochemical Society, Jun. 1982, pp. 1379–1381.

Grobman, "Multilayer Packaging using Resist Layers", I.B.M. Tech. Discl. Bulletin, 23(10), 3/81.

*Primary Examiner*—John F. Terapane

*Assistant Examiner*—Eric Jorgensen

[57] ABSTRACT

A method of manufacturing an integrated circuit chip utilizing a two-step process for converting an ordinary photoresist material to a useful dielectric. This is done by exposing the photoresist to an xenon flash lamp and then baking it at a high temperature. The converted photoresist is used as a permanent dielectric layer in the integrated chip.

7 Claims, 12 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF MANUFACTURING AN INTEGRATED CIRCUIT CHIP AND INTEGRATED CIRCUIT CHIP PRODUCED THEREBY

FIELD OF THE INVENTION

The invention relates to methods of fabricating semiconductor integrated circuit chips and to integrated circuit chips produced thereby. More particularly, the invention relates to the use of photoresist as a dielectric layer in such chips.

BACKGROUND AND SUMMARY OF THE INVENTION

As the number of devices such as transistors, diodes, capacitors, resistors, etc. on an integrated circuit increases, the complexity of interconnecting the devices often exceeds the capability of providing a corresponding interconnecting pattern on a single conductive layer. Providing several interconnection levels is highly desirable in very large scale integrated circuit technology, as it allows both higher packing density of the active components and greater freedom in their placement on the chip. Thus the denser integrated circuits have now required the use of two or more conductive layers to provide the required interconnections, with the two or more conductive layers being separated by an electrically insulating layer.

In conventional chip manufacturing, the silicon wafer is first oxidized to form a $SiO_2$ layer on the surface. Photoresist is then applied to the silicon wafer, dried, and then exposed with the proper geometrical pattern. After exposure, the wafer is soaked in a solution that develops the images in the photosensitive material. Depending on the type of polymer used for the photoresist, either exposed or unexposed areas of film are removed in the developing process. The wafer is then placed in an environment (e.g., a chemical solution), that etches surface areas not protected by the polymer pattern. Finally, the resist is stripped, leaving behind a $SiO_2$ image which then becomes a mask for subsequent processing. For example, an ion implant would dope the exposed silicon, but not the silicon covered by the oxide. After the $SiO_2$ is stripped, the silicon surface is left with a dopant pattern that duplicates the design pattern on the photomask. The complete circuit is built up by aligning the next photomask in the sequence to the pattern in the silicon and repeating the entire process, until all the components of the circuit have been constructed. All the individual components must now be connected together with a conductor pattern. When more than one level of conductors is necessary, then the levels must be separated with a dielectric layer. Electrical passages through holes in the dielectric, referred to as "vias", are formed to enable conduction between levels of conductors at the desired locations.

It is apparent that the above described method of integrated circuit chip manufacturing is complicated, time-consuming and expensive.

It is therefore an object of the present invention to provide an effective, but less complicated and less expensive method of integrated circuit chip manufacturing, when more than one level of conductors is needed.

The present invention utilizes a two-step process for converting an ordinary photoresist composition to a useful dielectric in a semiconductor chip. First, the photoresist material (after undesired photoresist is removed is exposed to a xenon flash light, as taught in U.S. Pat. No. 4,443,533, the disclosure of which is hereby incorporated by reference for exposure intensities, flash duration and other required parameters. This stabilizes the photoresistist and enables it to withstand temperatures up to 600° C. or more. In this condition, however, the photoresist contains volatile components (e.g., solvents). In the past, therefore, as shown in U.S. Pat. No. 4,443,533, the photoresist was eventually removed completely from the chip. However, in the present invention, instead of removing the photoresist after the steps of masking and developing, it is converted to a permanent dielectric by baking the chip at a high temperature (e.g., 300°–400° C. or more), to remove the volatile components photoresist. After baking, the photoresist is stable, has good dielectric properties, resists flowing at temperatures up to 600° C. or more, and functions in much the same manner as the prior art dielectric layer formed of oxide, nitride or the like. The converted photoresist can be used as a permanent dielectric. Therefore, fewer steps are necessary to achieve the same results during the manufacturing.

Thus the prior art steps of depositing an insulation layer before applying photoresist, ion or plasma etching that insulation layer to establish vias and then removing the remaining photoresist are eliminated. The vias are formed directly as part of the process of masking the photoresist and removing unwanted material.

This saves substantial expenses for capital equipment (such as the etching equipment), time and material, thereby reducing the cost of manufacturing.

BRIEF DESCRIPTION OF THE DRAWINGS

A better understanding of the present invention may be obtained from the accompanying description used in conjunction with the drawings in which.

DETAILED DESCRIPTION OF A PREFERRED EMBODIMENT

Figure 1:
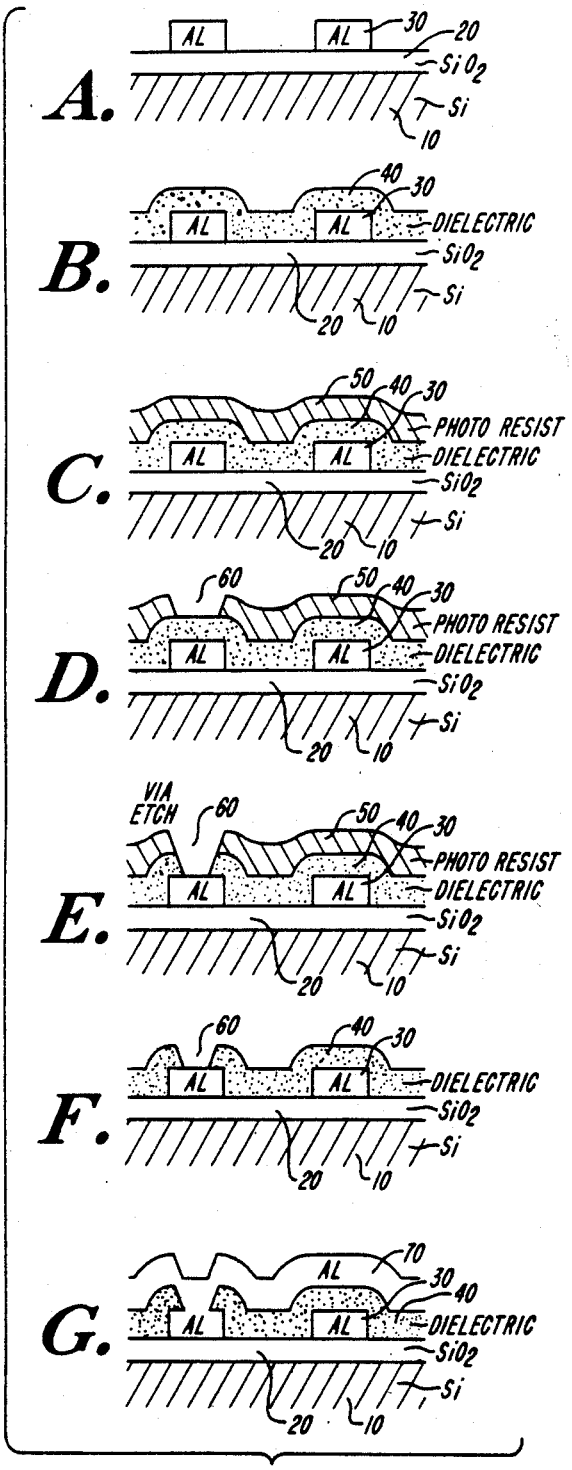
FIGS. 1A–1G are cross-sectional views of an integrated circuit chip in various sequential stages of the prior-art fabrication process.

Referring now to FIG. 1A, there is shown a semiconductor substrate 10 (e.g., silicon) which contains discrete components and is covered with a base layer 20 of insulation, and a first level of aluminum contacts 30 already deposited by a known conventional process.

With reference to FIG. 1B, a layer of dielectric material 40 is formed over the entire surface, covering aluminum contacts 30 and the insulation layer 20 underneath. The dielectric may be either an oxide, nitride, an oxynitride, or a polyimide.

The upper surface of the dielectric 40 is then coated with a layer of photoresist 50, which is masked and developed in a conventional manner to leave a photoresist layer covering the areas of dielectric 40 in which the vias will be formed in later processing steps (FIGS. 1C through 1D).

With reference to FIG. 1E, using a directional reactive ion etch (also called plasma etch), those portions of the dielectric layer 40 which are not covered by photoresist 50 are removed, resulting in the formation of vias 60 in the dielectric 40.

Then the remaining photoresist must be stripped (FIG. 1F), leaving the dielectric 40 with via holes 60 ready for the second level of aluminum interconnects (FIG. 1G).

By contrast, FIGS. 2A through 2E illustrate the steps of the fabrication process of integrated circuit chip according to the present invention.

Figure 2:
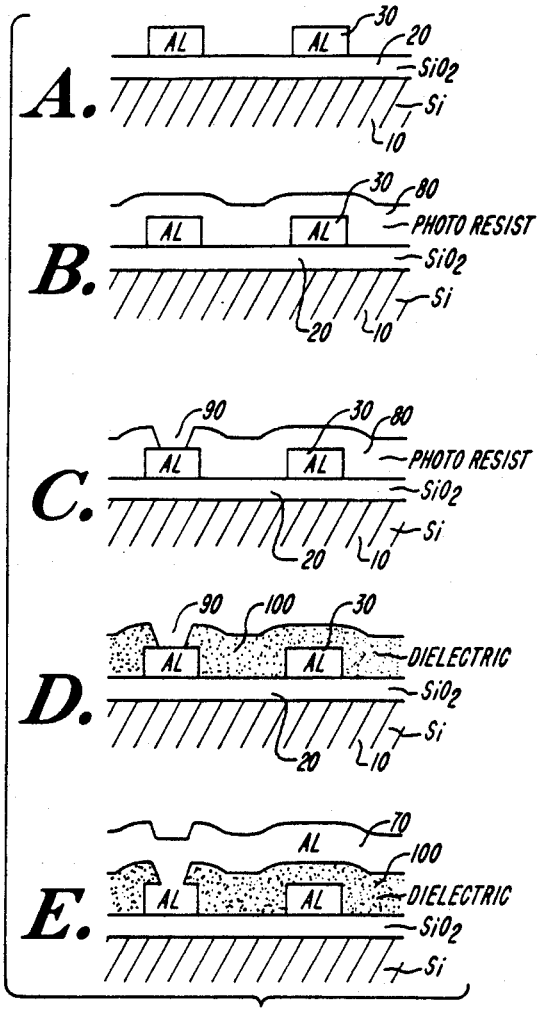
FIGS. 2A–2E are cross-sectional views of an integrated circuit chip in various sequential stages of the fabrication process of the present invention.

FIG. 2A shows a first layer of insulation 20 already grown and a first level of aluminum contacts 30 already deposited, as in FIG. 1A.

With reference to FIG. 2B a layer of photoresist 80 is applied over the entire surface, covering aluminum contacts 30 and the insulation material 20 underneath. The photoresist 80 is masked and developed as shown on FIG. 2C to form vias 90. The next step is to expose the photoresist 80 to a xenon flash lamp (using exposure parameters as taught in U.S. Pat. No. 4,443,533) to stabilize the photoresist, and then to bake it at temperatures higher than about 250°–400° C. to drive out volatile components (e.g. solvents) and thereby to convert it to permanent dielectric 100 (FIG. 2D). After the exposure and baking the cured photoresist is stable and resists flowing at temperatures up to 600° C. or more, has good dielectric properties, and functions in much the same manner as the dielectric in the prior art method.

Of course, the time and temperature to stabilize the photoresist and convert it to a permanent dielectric will depend on the composition of the photoresist and therefore will have to be determined experimentally. As an example, however, using Kodak 820 positive photoresist, it is believed that an approximate time for baking is one-half hour at a temperature 250° C.

The second level of aluminum interconnects 70 now can be formed by conventional methods.

The present invention improves the process of manufacturing integrated circuit chips by using fewer steps to achieve substantially the same results. The present manufacturing process does not require the steps of depositing of insulation layer before applying photoresist and it also eliminates the step of plasma etching of vias through the insulation layer. This process therefore does not require much of the expensive capital equipment, material and time, needed for these operations. Specifically, it does not require etching machinery, which may cost about $150,000–$200,000 and requires neither the insulation (i.e. dielectric) depositing equipment nor the insulation material itself. And based on current analysis, a three-fold to six-fold reduction in dielectric fabrication time is expected.

Having thus described an exemplary embodiment of the invention, it will be apparent that various alterations, modifications and improvements will readily occur to those skilled in the art. Such obvious alterations, modifications and improvements, though not expressly described above, are nonetheless intended to be implied and are within the spirit and scope of the invention. Accordingly, the foregoing discussion is intended to be illustrative only, and not limiting; the invention is limited and defined only by the following claims and equivalents thereto.

What is claimed as new and desired to be secured by Letters Patent of the United States is:

1. A method of manufacturing an integrated circuit chip starting from an insulation layer having a first level of metallic contacts thereon comprising the steps of:

(a) applying a layer of photoresist to cover the metallic contacts and the insulation layer underneath;

(b) masking and exposing the photoresist, to define the vias;

(c) developing the photoresist to form vias;

(d) after developing the photoresist, converting the developed photoresist into a permanent dielectric, said step of converting including the steps of temperature stabilizing the photoresist followed by heat treating the photoresist to remove volatile components therefrom; and (e) forming a second level of metallic contacts.

2. The method of claim 1 wherein the step of forming a second level of metallic contacts includes the step of connecting the second level of metallic contacts with the first level of metallic contacts through the vias in the converted photoresist.

3. The method of claim 1 in which the step of converting the photoresist into permanent dielectric further comprises the steps of:

(a) exposing the photoresist to a xenon flash lamp; and (b) baking the photoresist at a temperature and for a time sufficient to remove volatile components therefrom.

4. The method of claim 3 wherein the step of forming a second level of metallic contacts includes the step of connecting the second level of metallic contacts with the first level of metallic contacts through the vias in the converted photoresist.

5. An integrated circuit chip manufactured on a substrate covered by an insulation layer with a first level of metallic contacts deposited thereon, said chip having been manufactured by a process comprising the steps of:

(a) applying a layer of photoresist to cover the metallic contacts and the insulation layer underneath;

(b) masking and exposing the photoresist to define the vias;

(c) developing the photoresist to form vias;

(d) after developing the photoresist, converting the developed photoresist into a permanent dielectric, said step of converting including the steps of temperature stabilizing the photoresist followed by heat treating the photoresist to remove volatile components therefrom; and (e) forming a second level of metallic contacts.

6. An integrated circuit chip as defined in claim 5, wherein in the manufacturing process the step of converting the developed photoresist into permanent dielectric further comprises the steps of:

(a) exposing the photoresist to a xenon flash lamp; and (b) baking the photoresist at a temperature and for a time sufficient to remove volatile components therefrom.

7. A method for forming a patterned insulating layer on a semiconductor device comprising the steps of:

applying a layer of photoresist material over the surface of the semiconductor device;

masking and exposing the photoresist material to define a pattern thereon;

developing the photoresist material to remove undesired portions and form said pattern;

after developing the photoresist material, temperature stabilizing the patterned photoresist material by exposure to a xenon flash lamp; and after exposure to a xenon flash lamp, baking the patterned photoresist material at a temperature and for a time sufficient to remove volatile components therefrom and form a permanent dielectric.

* * * * *